(12) United States Patent
Wong

(10) Patent No.: US 7,250,884 B1
(45) Date of Patent: Jul. 31, 2007

(54) ANALOG-TO-DIGITAL CONVERTERS FOR CONTROL LOOP APPLICATIONS

(75) Inventor: Hee Wong, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/284,763

(22) Filed: Nov. 21, 2005

(51) Int. Cl.
*H03M 1/84* (2006.01)

(52) U.S. Cl. ........................ 341/138; 341/155

(58) Field of Classification Search ......... 341/110–170
See application file for complete search history.

(56) References Cited

U.S. PATENT DOCUMENTS

| | | | |
|---|---|---|---|
| 4,112,426 A * | 9/1978 | Hofer et al. ............... | 341/108 |
| 5,583,501 A * | 12/1996 | Henrion et al. ............ | 341/118 |
| 5,594,439 A * | 1/1997 | Swanson ................. | 341/118 |
| 5,668,549 A | 9/1997 | Opris et al. | |
| 5,923,275 A | 7/1999 | Kalb | |
| 5,929,796 A | 7/1999 | Opris et al. | |
| 6,097,326 A | 8/2000 | Opris et al. | |
| 6,549,031 B1 * | 4/2003 | Jex et al. ................. | 326/30 |
| 7,088,279 B2 * | 8/2006 | Muramatsu et al. ........ | 341/155 |

OTHER PUBLICATIONS

F. Francesconi et al., "A Low Power Logarithmic A/D Converter", 1996 IEEE, pp. 473-476, no month.
Shiro Sakiyama et al., "An Oversampling ADC with Non-Linear Quantizer for PCM-CODEC", IEEE Symposium on VLSI Circuits Digest of Technical Papers, 1994, pp. 103-104, no month.
K. Narayanasami et al., "A Design Technique for Nonuniform Quantizer in PCM Generation", IEEE Transactions on Circuits and Systems, vol. CAS-29, No. 3, Mar. 1982, pp. 193-196.
A.J. Magrath et al., "Performance Enhancement of Sigma-Delta Modulator D-A Converters Using Non-Linear Techniques", 1996 IEEE, pp. 277-280, no month.
Jorge Guilherme et al., "A True Logarithmic Analog-to-Digital Pipeline Converter with 1.5 bit/stage and Digital Correction", 2001 IEEE, pp. 393-396, no month.

* cited by examiner

*Primary Examiner*—Lam T. Mai

(57) ABSTRACT

An analog-to-digital converter error detector suitable for single-chip control loop applications employs a single comparator determining the difference between an initial input voltage and a reference voltage in one or more conversion iterations, with the difference reduced in nonlinear steps during each conversion iteration based on the ratio between sampling and discharge capacitances. The number of conversion iterations required to reduce the initial input voltage to below the reference voltage is counted as representing the difference, with output codes representing the conversion iteration count having a step size increasing with the count value and selected to reduce downstream processing.

20 Claims, 10 Drawing Sheets

ANALOG-TO-DIGITAL CONVERTERS FOR CONTROL LOOP APPLICATIONS

CROSS-REFERENCE TO RELATED APPLICATIONS

This application is related to the subject matter of commonly-assigned co-pending U.S. patent application Ser. No. 11/204,285 entitled FINE-RESOLUTION EDGE-EXTENDING PULSE WIDTH MODULATOR, Ser. No. 11/204,297 entitled DITHER SCHEME USING PULSE-DENSITY MODULATION (DITHER PDM), and Ser. No. 11/204,284 entitled DIGITAL DEAD-TIME CONTROLLER FOR PULSE WIDTH MODULATORS. The content of the above-identified applications is hereby incorporated by reference.

TECHNICAL FIELD OF THE INVENTION

The present invention is directed, in general, to analog-to-digital converters for control loop applications and, more specifically, to single-chip analog-to-digital converters and digital signal processors for signal filtering before applying error correction.

BACKGROUND OF THE INVENTION

In control systems such as switching power supplies, servo loops, and robotic controllers, error detection is always the first step before the control loop can execute any other function. Error detection determines the magnitude of necessary error correction, if any, and typically may be taken either from the output of a simple voltage comparator or an analog-to-digital converter (ADC). In the case of the analog-to-digital converter, the output is generally filtered by a downstream digital signal processor (DSP) before applying error correction.

In single-chip controller applications where cost and power are major design concerns, the analog-to-digital converter and the digital signal processor must have a simple architecture and an efficient coding scheme so that the downstream digital signal processor may be optimized for size and power. However, conventional analog-to-digital converter and digital signal processor architectures generally do not offer such a solution.

There is, therefore, a need in the art for a simple architecture analog-to-digital converter with output coding simplifying downstream digital filter design.

SUMMARY OF THE INVENTION

To address the above-discussed deficiencies of the prior art, it is a primary object of the present invention to provide, for use in an analog-to-digital converter error detector suitable for single-chip control loop applications, a single comparator determining the difference between an initial input voltage and a reference voltage in one or more conversion iterations, with the difference reduced in nonlinear steps during each conversion iteration based on the ratio between sampling and discharge capacitances. The number of conversion iterations required to reduce the initial input voltage to below the reference voltage is counted as representing the difference, with output codes representing the conversion iteration count having a step size increasing with the count value and selected to reduce downstream processing.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 3F, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
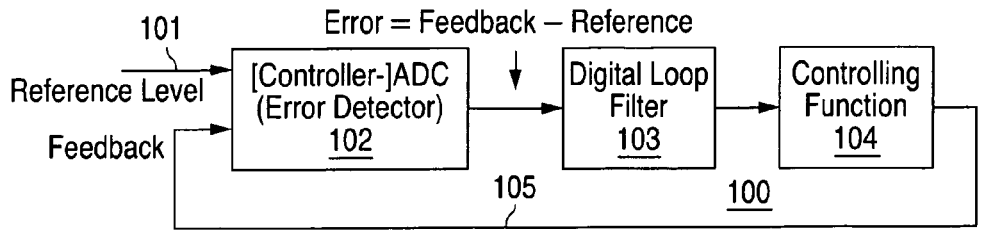
FIG. 1 is a high level block diagram of a system within which a controller analog-to-digital converter may be implemented according to one embodiment of the present invention.

FIG. 1 is a high level block diagram of a system within which a controller analog-to-digital converter may be implemented according to one embodiment of the present invention. System 100 includes an input 101 for receiving a reference level signal at an analog-to-digital converter 102 functioning as an error detector. The analog-to-digital converter 102 is preferably a controller analog-to-digital converter described in further detail below. An error signal computed as the difference between the reference level signal and a feedback signal is produced by the analog-to-digital converter 102 and forwarded to a digital loop filter 103. Digital loop filter 103 filters the error signal and forwards the filtered error signal to a controlling unit 104, which produces a feedback signal returned to the analog-to-digital converter 102.

Those skilled in the art will recognize that a complete system is not depicted in FIG. 1 or described herein. Instead, only so much of a system involving use of an analog-to-digital converter as is unique to the present invention or necessary for an understanding of the present invention is depicted and described herein. The components depicted in FIG. 1 may be used to implement the corresponding components depicted and described in the related applications identified above.

Figure 2A:
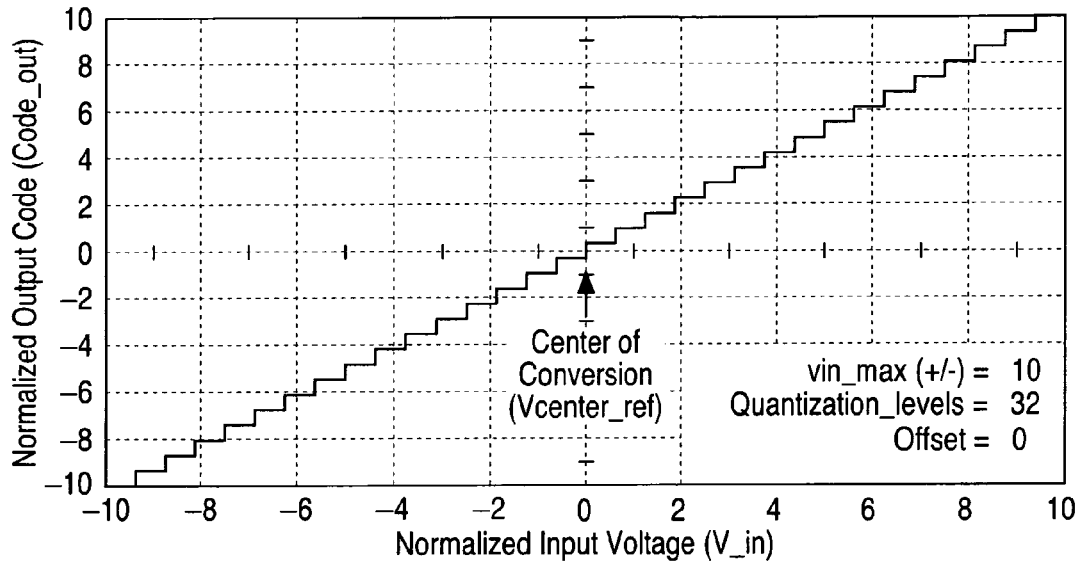
FIGS. 2A through 2F are comparative diagrams illustrating the transfer characteristics of various implementations of an analog-to-digital converter.

FIGS. 2A through 2F are comparative diagrams illustrating the transfer characteristics of various implementations of an analog-to-digital converter. FIG. 2A depicts the transfer function of a full-range analog-to-digital converter. In the transfer function depicted, up to a multiple of ten times a unit value for the normalized input voltage Vinput (the reference level of FIG. 1) in either direction correspond to 32 quantization levels with no offset. The design enjoys low tracking noise and fast loop acquisition, but suffers from high implementation cost, high power consumption and only moderate voltage accuracy at the center of conversion Vcenter_ref.

Figure 2B:
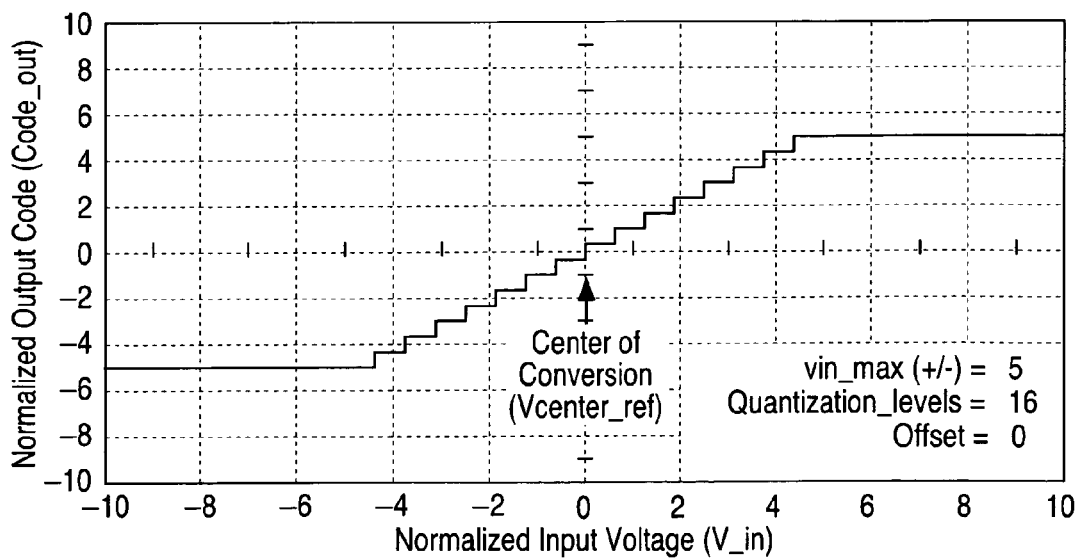

FIG. 2B depicts the transfer function of a windowed analog-to-digital converter, in which sensitivity is limited to only up to five times the unit value of the normalized input voltage V_in in either direction, corresponding to sixteen quantization levels with no offset. The design has low tracking noise and moderate cost and power consumption but still only moderate voltage accuracy at the center of conversion, and also suffers from slow loop acquisition due to reduced gain at high-valued inputs.

Figure 2C:
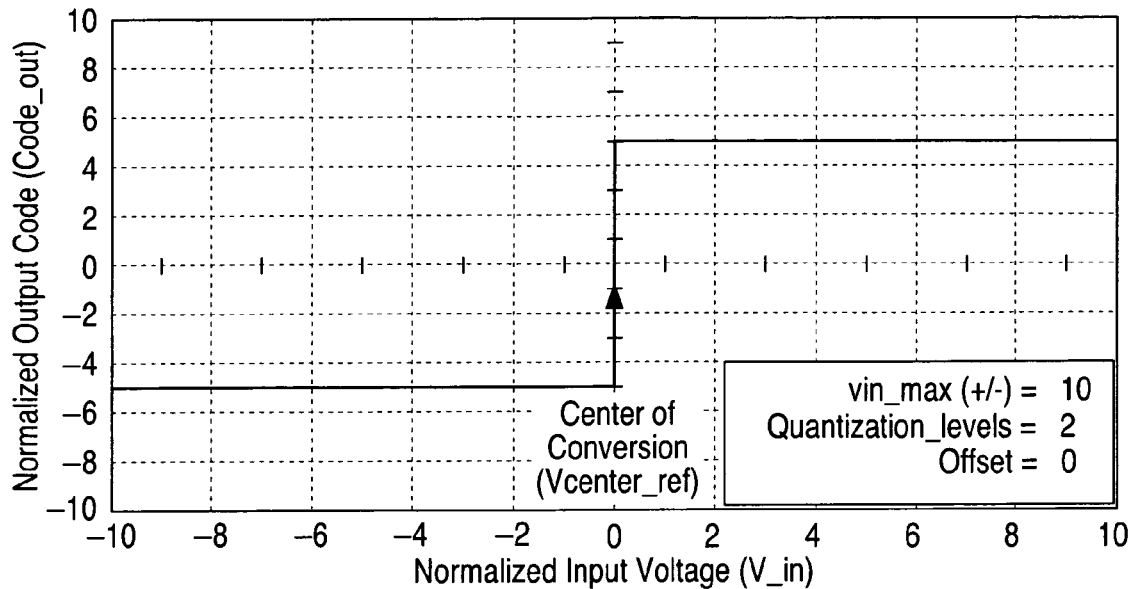

FIG. 2C illustrates the transfer function of a sign-only analog-to-digital converter, where input voltages of up to ten times the unit value in either direction correspond to only two quantization values with no offset. While enjoying low cost and power consumption and high voltage accuracy at the center of conversion, this design suffers from high tracking noise due to high conversion gain at the center of conversion and poor loop acquisition due to reduced gain at high input values (whereas the full-range analog-to-digital converter has high gain at high input values).

Figure 2D:
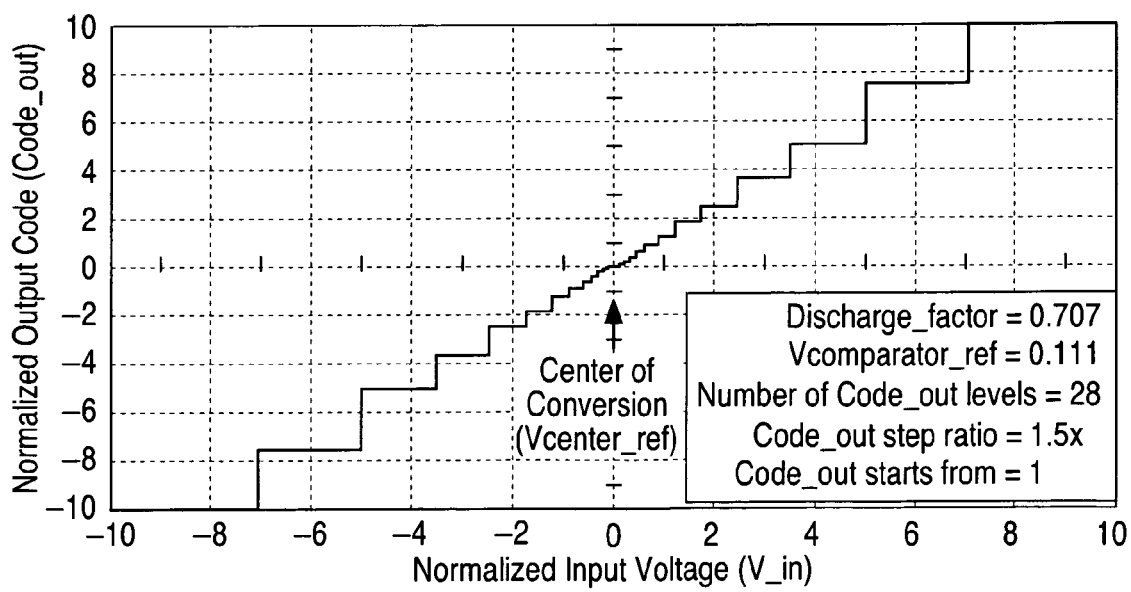

FIG. 2D illustrates the transfer function of a controller analog-to-digital converter according to one embodiment of the present invention. When implemented with a discharge factor of 0.707 based on a voltage comparator reference of 0.111 units, the output Code_out starts from 1, has a step ratio of 1.5x, and has 28 levels. This design is low cost and has low power consumption with fast loop acquisition (high gain at high input values), high voltage accuracy at the center of conversion, and low tracking noise (high resolution at the center of conversion). However, an iterative conversion topology is required.

Figure 2E:
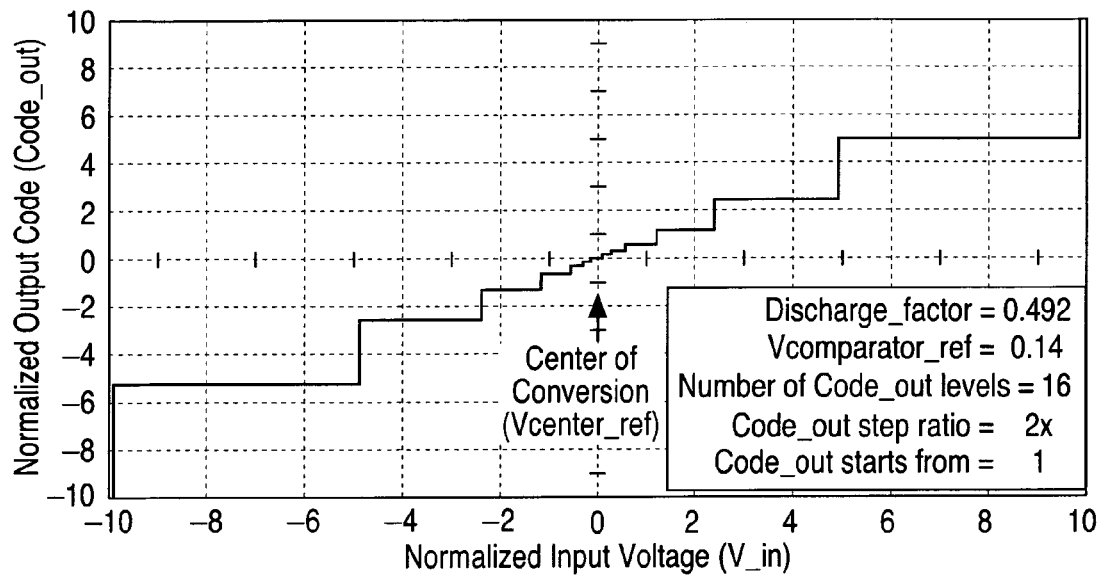
Figure 2F:
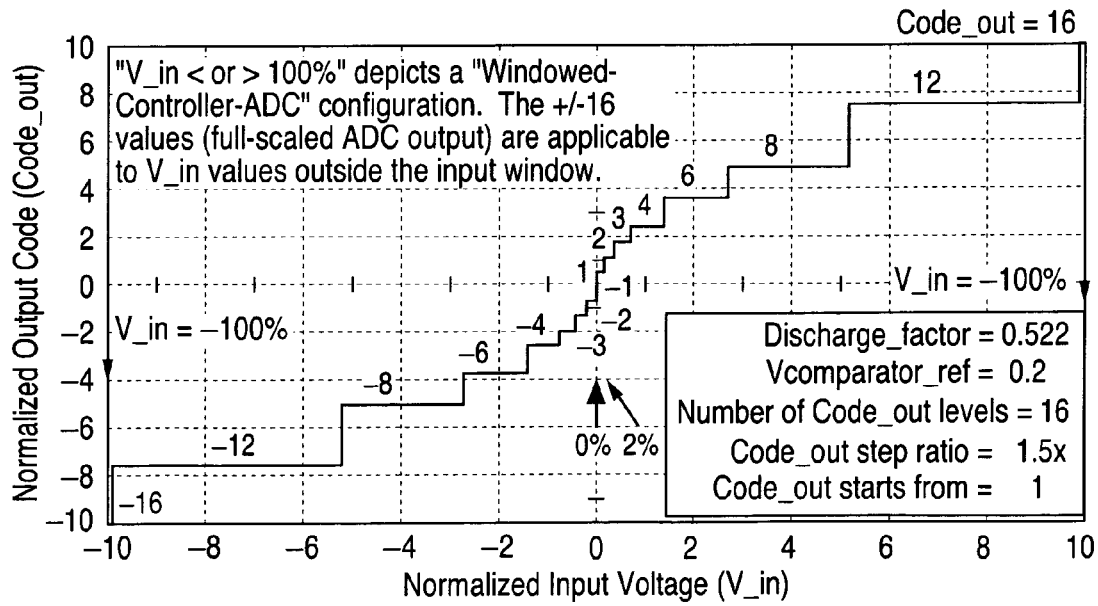

FIGS. 2E and 2F illustrate the transfer function for a controller analog-to-digital converter according to various alternative embodiments of the present invention. In both cases, sixteen output levels are produced (Code_out steps equal ±8), monotonic conversion and no missing codes with the output Code_out starting from 1. The implementation of FIG. 2E utilizes a discharge factor of 0.492, a voltage comparator reference of 0.14, and a "one-1-pattern" output code scheme to reduce downstream processing, with a step ratio of 2x, as described in further detail below. The implementation of FIG. 2F employs a discharge factor of 0.522, a voltage comparator reference of 0.2, and a "two-1-pattern" output code scheme also reducing downstream processing, with a step ratio of 1.5x, as described further below.

Figure 3:
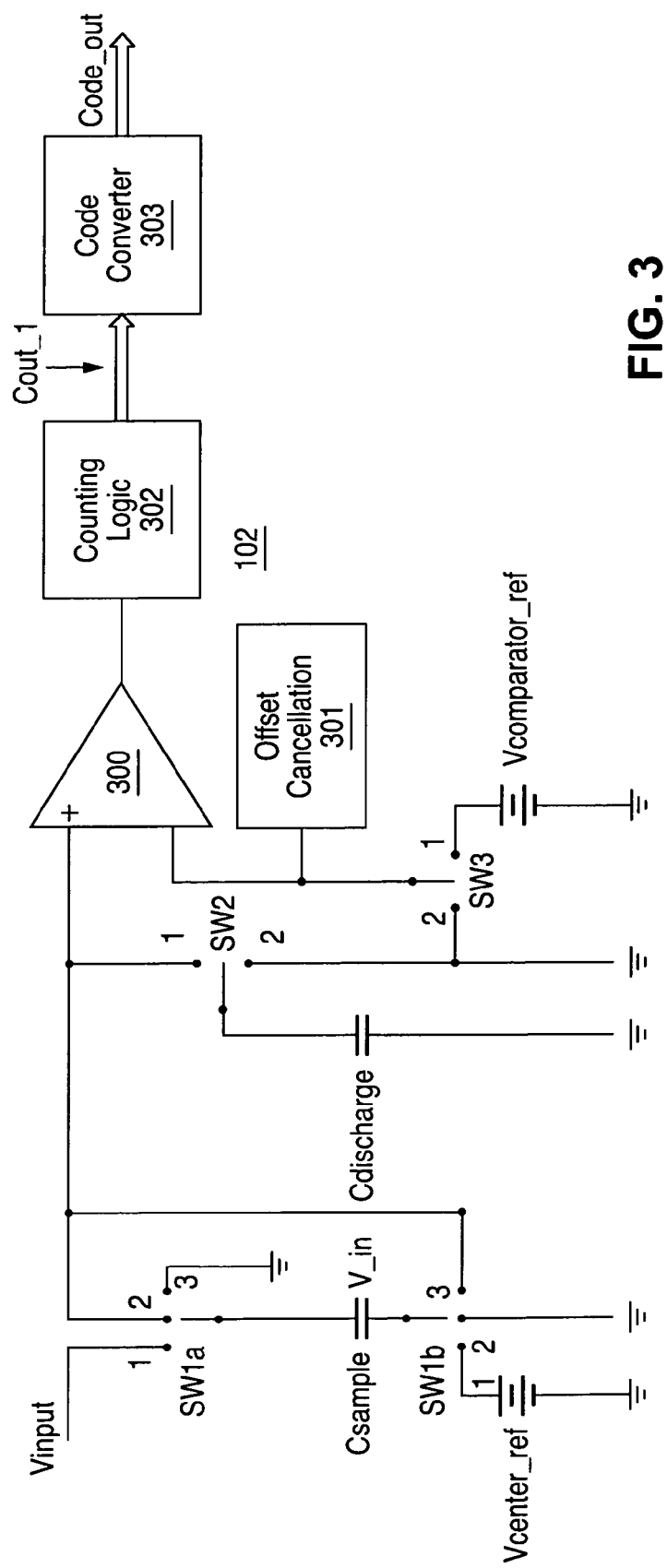
FIG. 3 is a diagram of a controller analog-to-digital converter according to one embodiment of the present invention.

FIG. 3 is a diagram of a controller analog-to-digital converter according to one embodiment of the present invention. The exemplary embodiment of controller analog-to-digital converter 102 depicted in FIG. 3 has been simplified for the purposes of illustrating the invention. Actual silicon implementations should follow standard switched-capacitor design practices.

Controller analog-to-digital converter 102 includes an input receiving the input voltage Vinput, which is selectively connected by switch SW1a (at node 1 thereof) to one terminal of a sampler capacitor Csample. The same terminal of capacitor Csample may alternatively be selectively connected by switch SW1a (via node 2 thereof) to the positive input of a comparator 300 or (via node 3 of switch SW1a) to a ground voltage.

The other terminal of capacitor Csample may be selectively connected by switch SW1b to either the positive input of comparator 300 (via node 3 of switch SW1b), the ground voltage (via node 2 of switch SW1b), or a center reference voltage Vcenter_ref above the ground voltage (via node 1 of switch SW1b). The value of Vcenter_ref affects the center of conversion.

Controller analog-to-digital converter 102 also includes a discharge capacitor Cdischarge connected to the ground voltage at one terminal and at the other terminal by switch SW2 selectively to either the positive input of comparator 300 (via node 1 of switch SW2) or to the ground voltage (via node 2 of switch SW2). The ratio of the capacitances Csample/Cdischarge affects conversion gain and the number of output Code_out levels.

The null offset (negative) input of comparator 300 is connected to an offset cancellation unit 301 and, by switch SW3, selectively to either a comparator reference voltage Vcomparator_ref above the ground voltage (via node 1 of switch SW3) or to the ground voltage (via node 2 of switch SW3). The value of Vcomparator_ref affects conversion gain and the number of output Code_out levels. The output of comparator 300 is received by counting logic 302, which produces a count code Cout_1 received by code converter 303 producing the output code Code_out.

FIGS. 3A through 3F illustrate operation of a controller analog-to-digital converter according to one embodiment of the present invention. In each figure, portions of the controller analog-to-digital converter 102 that are not involved in the particular phase of the operations being described are shown in dashed lines. The steps are performed in the order of the figures unless otherwise noted.

Figure 3A:
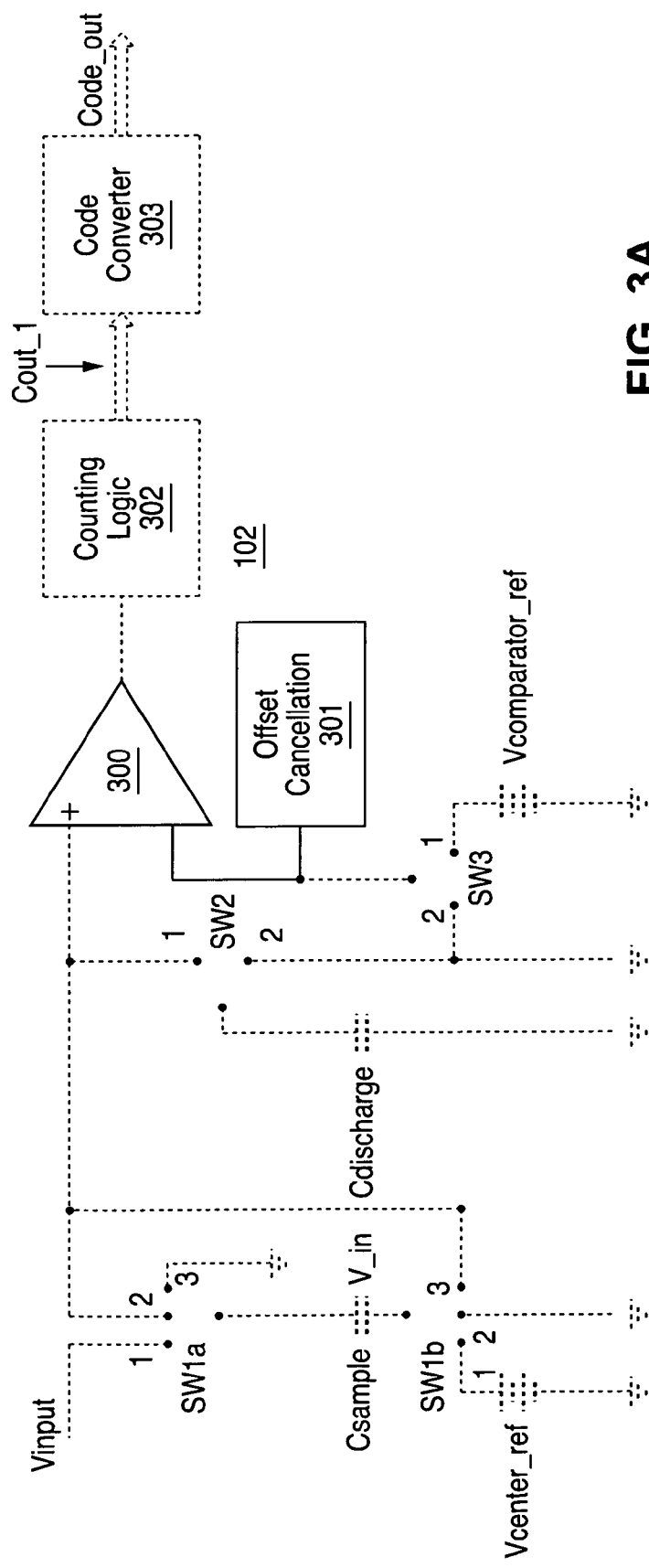
FIGS. 3A through 3F illustrate operation of a controller analog-to-digital converter according to one embodiment of the present invention.

FIG. 3A illustrates the first step, in which any offset to comparator 300 is canceled. Any conventional offset cancellation technique may be employed, and applied to the null offset of the comparator 300. Cancellation may be performed during power-up or any similar condition, or this step may optionally be bypassed for low cost applications.

Figure 3B:
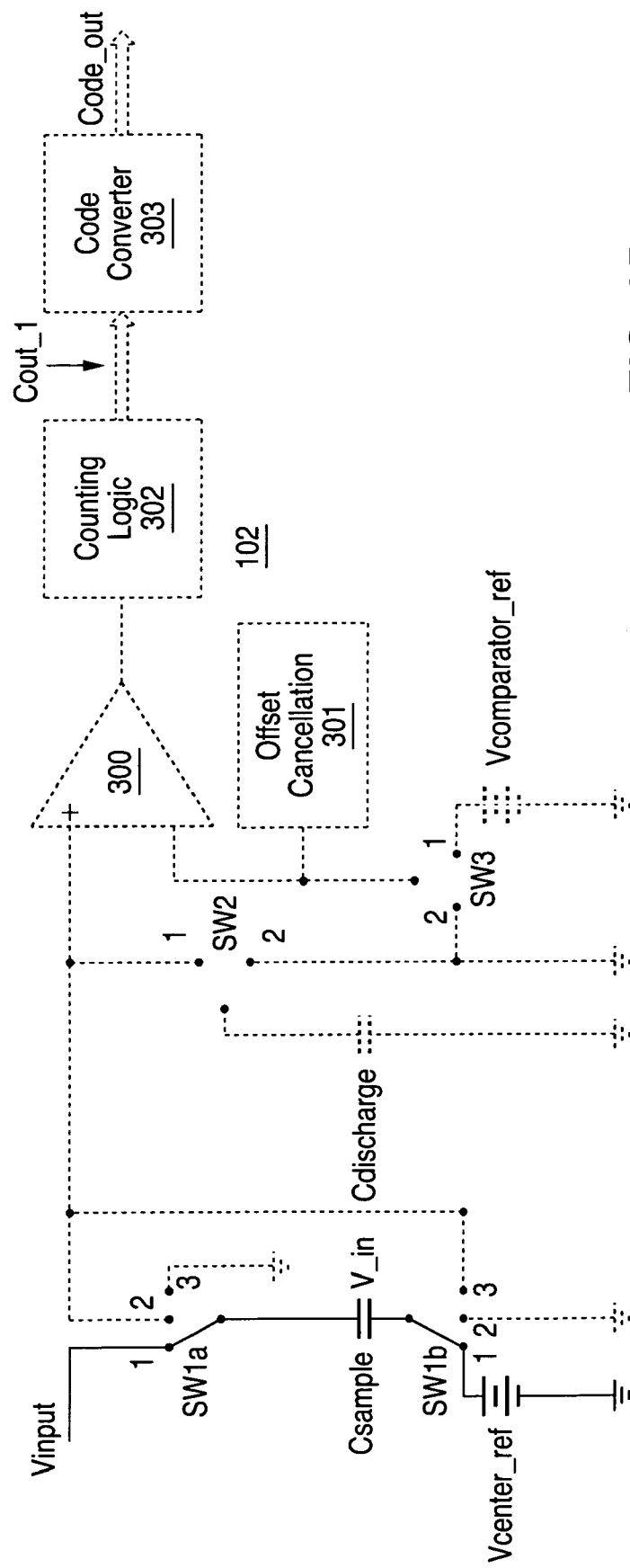

FIG. 3B depicts sampling of the input voltage Vinput (one of the reference level voltage and the feedback voltage in FIG. 1) and setting the voltage on capacitor Csampler. Switches SW1a and SW1b are each connected to internal node 1 therein, and capacitor Csample is charged to the voltage value V_in=Vinput−Vcenter_ref. Vcenter_ref thus determines the center of conversion.

Figure 3C:
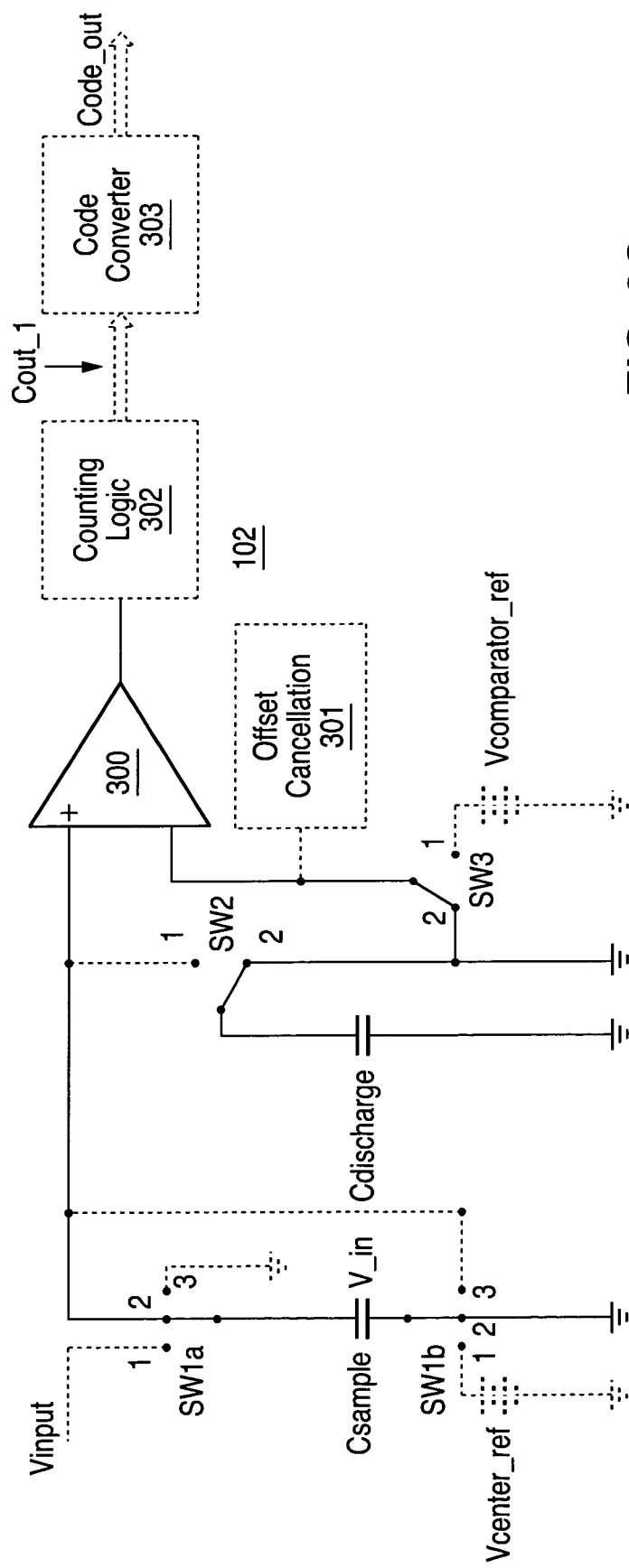

FIG. 3C illustrates determination of the polarity of V_in and setting of switch SW1. All four switches SW1a, SW1b, SW2 and SW3 are connected to internal node 2 therein, and comparator 300 is employed to determine the polarity of V_in. If V_in is negative, switches SW1a and SW1b are both changed to connected to internal node 3 therein, but otherwise switches SW1a and SW1b are left connected to internal node 2.

Figure 3D:
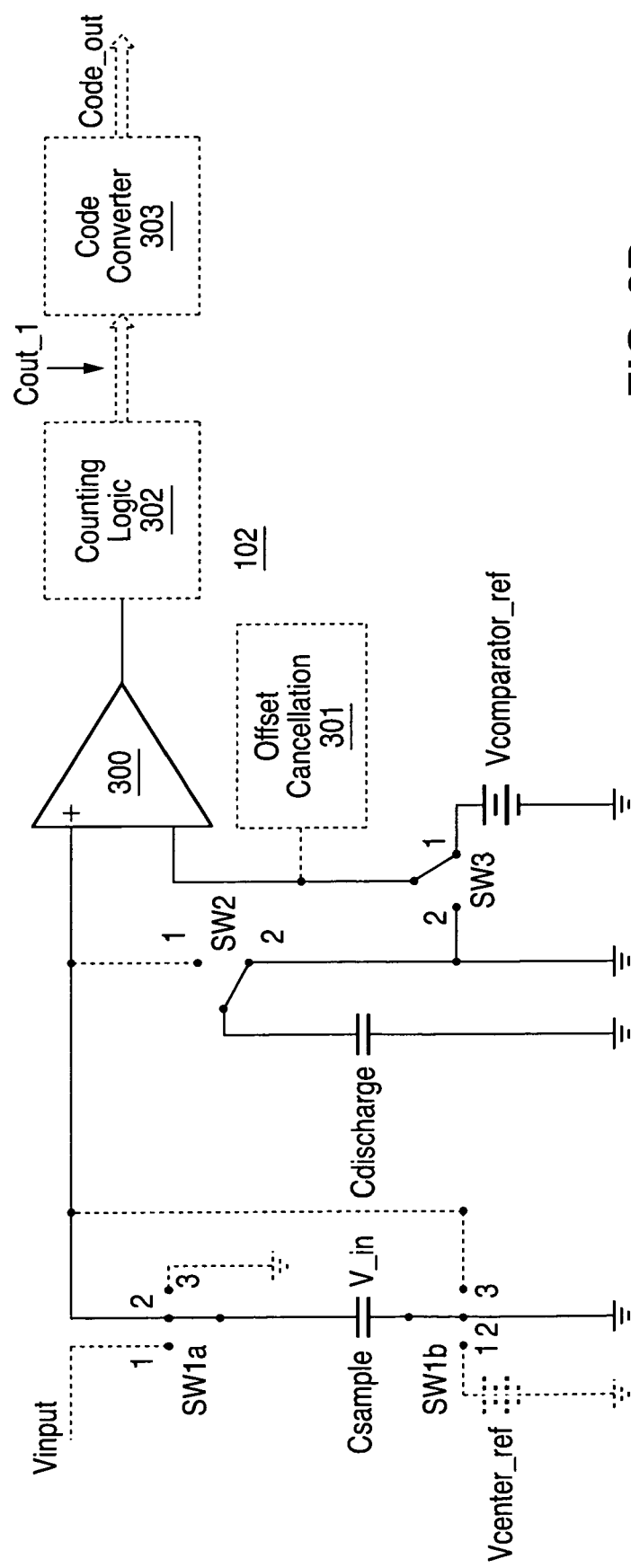

FIG. 3D depicts comparing the sampled, centered input V_in to the reference voltage Vcomparator_ref (the other of the reference level voltage and the feedback voltage in FIG. 1). Switch SW3 is moved to connection with internal node 3 for that purpose. If V_in is less than Vcomparator_ref, then the process proceeds to the step illustrated in FIG. 3F.

Figure 3E:
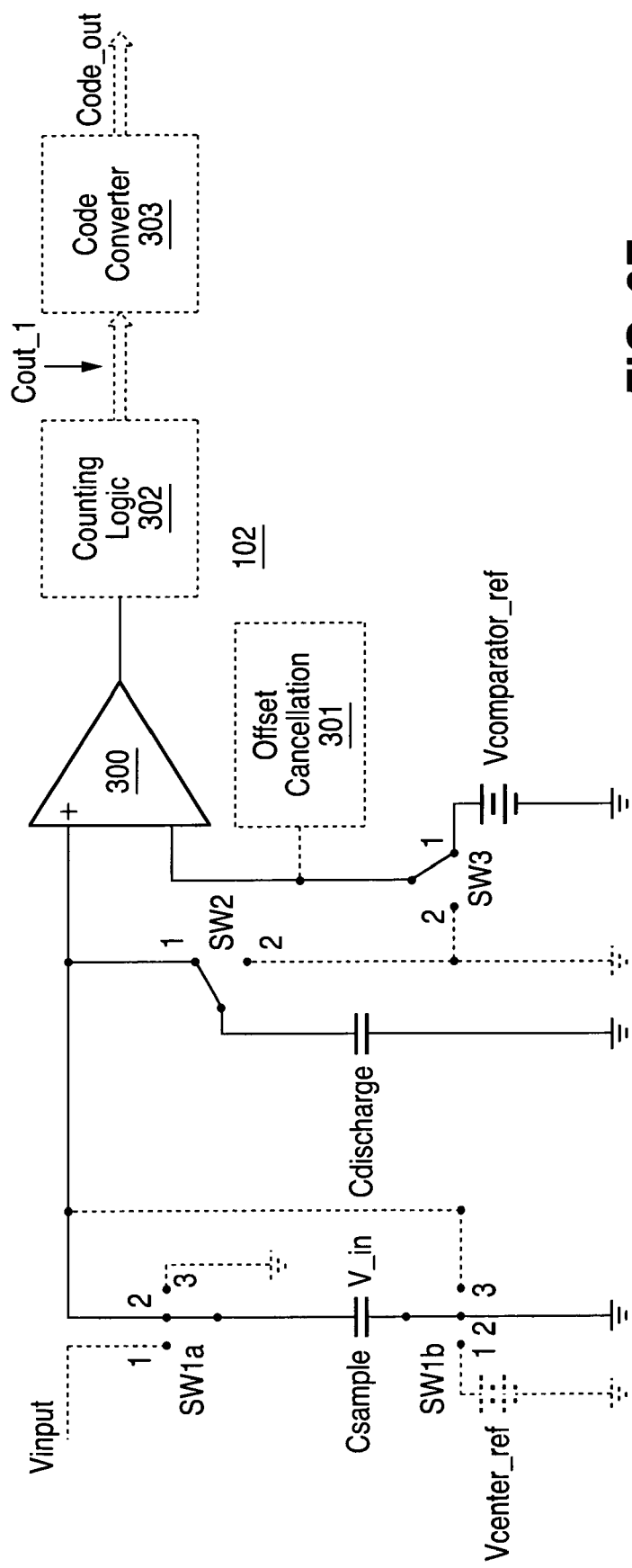

FIG. 3E illustrates discharging the capacitors Csample and Cdischarge if V_in is (or remains) greater than Vcomparator_ref. Switch SW2 is connected to internal node 1 therein to discharge capacitor Csample, with the discharge controlled by the ratio Discharge_factor=Csample/(Csample+Cdischarge). After settling, switch SW2 is moved to connection with internal node 2 to discharge capacitor Cdischarge. The process then returns to the step illustrated in FIG. 3D.

Figure 3F:
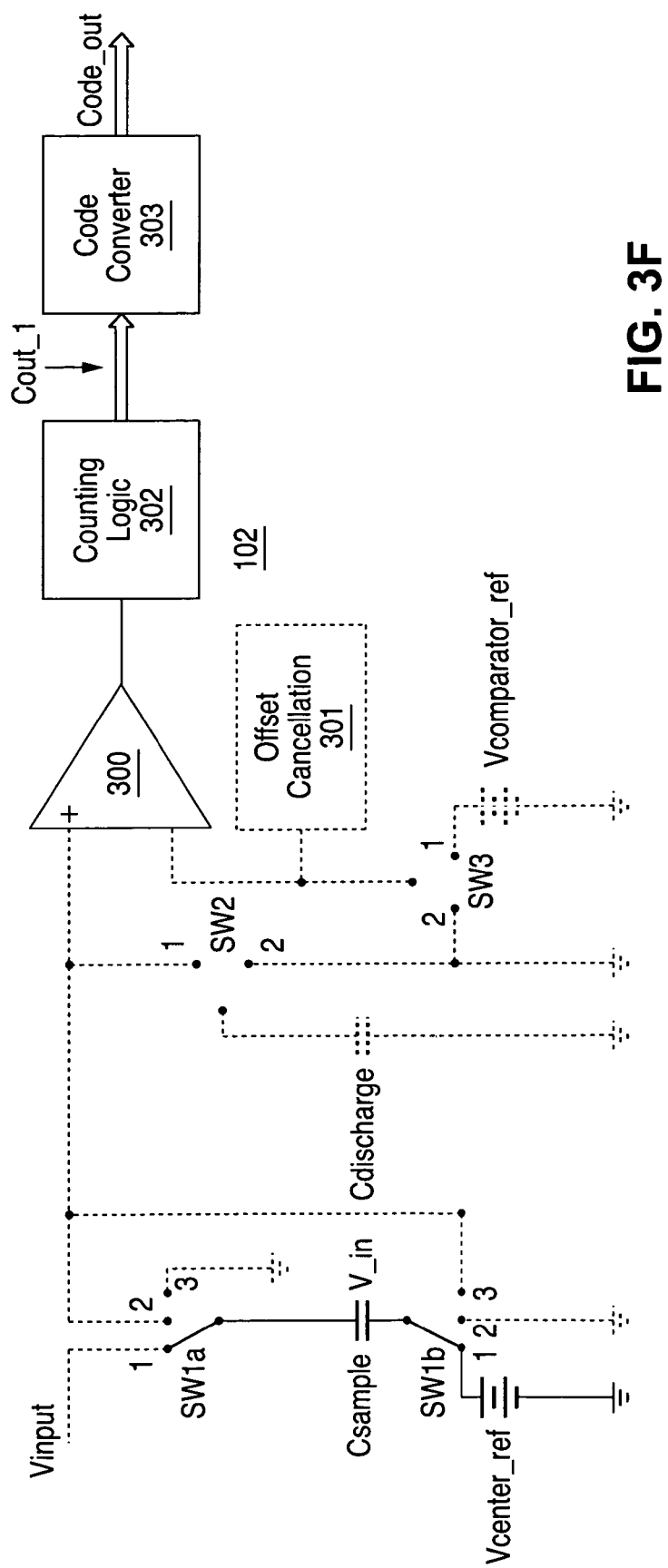

FIG. 3F depicts obtaining the final controller analog-to-digital output Code_out. During the steps illustrated in FIGS. 3D and 3E (if performed), the value Cout_1 is computed based on the states of the output of comparator 300 as described in further detail below. The value Cout_1 is then converted to Code_out using a table such as those given below, and the final output of the controller analog-to-digital converter 102 is made available at the output Code_out.

An example of the counting algorithm used to count the value Cout_1 is:

---

Circuit parameters:

| | | | |
|---|---|---|---|
| Discharge_factor | = | 0.5 | //Discharge_factor = Csample/ //(Csample + Cdischarge) |
| V_in starting value | = | 1 V | //Controller-ADC input |
| Vcomparator_ref | = | 1 mV | //stop conversion if V_in is //less that this value |

Cout_1 Counting Algorithm:

| | | | |
|---|---|---|---|
| 1. V_in = 1000 | mV | //Starting value, V_in = Vinput − //Vcenter_ref | |
| 2. V_in = 500 | mV | //use Cdischarge to reduce the //charge on Csample | |
| 3. V_in = 250 | mV | //repeat discharging until V_in is //less than Vcomparator_ref | |
| 4. V_in = 125 | mV | // | |
| 5. V_in = 62.5 | mV | // | |
| 6. V_in = 31.25 | mV | // | |
| 7. V_in = 15.63 | mV | // | |
| 8. V_in = 7.81 | mV | // | |
| 9. V_in = 3.91 | mV | // | |
| 10. V_in = 1.95 | mV | // | |
| 11. V_in = 0.98 | mV | //V_in is less than //Vcomparator_ref, stop conversion | |

---

As can be seen, the discharge steps illustrated in FIGS. 3D and 3E are repeated, with a discharge factor of 0.5 for this example (i.e., the value of V_in represented by the charge on Csample is reduced by half during each discharge step), until the value V_in is less than the comparator reference value Vcomparator_ref. Counting logic 302 produces a count Cout_1=10 for the example above, because eleven discharge steps were required to bring the value V_in below the reference voltage Vcomparator_ref. (The last discharge step, which brought the value of V_in below the reference voltage Vcomparator_ref, is not counted).

The count Cout_1 is then converted by a look-up table to the final output Code_out. The conversion may be accomplished in a number of ways, a selected few of which are illustrated in TABLES I through IV below. In each example, the argument to the lookup function Code_out[ ] is either (a) the value of the count Cout_1, or (b) Cout_1+1 rather than Cout_1 if Code_out starts from 1.

TABLE I below illustrates a coding scheme in which the count value Cout_1 is directly represented by the binary code for the count value:

TABLE I

| Code_out value (based on lookup on Cout_1) | Binary representation |
|---|---|
| Code_out[ 0] = 0 | 0 |
| Code_out[ 1] = 1 | 1 |
| Code_out[ 2] = 2 | 10 |
| Code_out[ 3] = 3 | 11 |
| Code_out[ 4] = 4 | 100 |
| Code_out[ 5] = 5 | 101 |
| Code_out[ 6] = 6 | 110 |
| Code_out[ 7] = 7 | 111 |
| Code_out[ 8] = 8 | 1000 |
| Code_out[ 9] = 9 | 1001 |
| Code_out[10] = 10 | 1010 |
| Code_out[11] = 11 | 1011 |
| Code_out[12] = 12 | 1100 |
| Code_out[13] = 13 | 1101 |
| Code_out[14] = 14 | 1110 |
| Code_out[15] = 15 | 1111 |

No conversion of binary representations of the output Code_out is performed (i.e., Code_out=Cout_1).

TABLE II illustrates a coding scheme in which the count value Cout_1 is represented by a "two-1-pattern" binary code for the count value, with a Code_out average step ratio of 1.25x (e.g., 40/32=1.25):

TABLE II

| Code_out value (based on lookup on Cout_1) | Binary representation |
|---|---|
| Code_out[ 0] = 0 | 0 |
| Code_out[ 1] = 1 | 1 |
| Code_out[ 2] = 2 | 10 |
| Code_out[ 3] = 3 | 11 |
| Code_out[ 4] = 4 | 100 |
| Code_out[ 5] = 5 | 101 |
| Code_out[ 6] = 6 | 110 |
| Code_out[ 7] = 8 | 1000 |
| Code_out[ 8] = 10 | 1010 |
| Code_out[ 9] = 12 | 1100 |
| Code_out[10] = 16 | 1 0000 |
| Code_out[11] = 20 | 1 0100 |
| Code_out[12] = 24 | 1 1000 |
| Code_out[13] = 32 | 10 0000 |
| Code_out[14] = 40 | 10 1000 |
| Code_out[15] = 48 | 11 0000 |

The binary representations of the output Code_out have a maximum of two logical 1's therein, a coding scheme that reduces "adding steps" during number multiplications. The step ratio between each pair of consecutive Code_out values facilitates achieving both high gain at high input (error) values for fast loop acquisition and high resolution at the center of conversion for high voltage accuracy and low tracking noise at the center.

TABLES III and IV are similar to TABLE II, but with a Code_out average step ratio of 1.5x and 2x, respectively:

TABLE III

| Code_out value (based on lookup on Cout_1) | Binary representation |
|---|---|
| Code_out[ 0] = 0 | 0 |
| Code_out[ 1] = 1 | 1 |
| Code_out[ 2] = 2 | 10 |
| Code_out[ 3] = 3 | 11 |
| Code_out[ 4] = 4 | 100 |
| Code_out[ 5] = 6 | 110 |
| Code_out[ 6] = 8 | 1000 |
| Code_out[ 7] = 12 | 1100 |
| Code_out[ 8] = 16 | 1 0000 |
| Code_out[ 9] = 24 | 1 1000 |
| Code_out[10] = 32 | 10 0000 |
| Code_out[11] = 48 | 11 0000 |
| Code_out[12] = 64 | 100 0000 |
| Code_out[13] = 96 | 110 0000 |
| Code_out[14] = 128 | 1000 0000 |
| Code_out[15] = 192 | 1100 0000 |

TABLE IV

| Code_out value (based on lookup on Cout_1) | Binary representation |
|---|---|
| Code_out[ 0] = 0 | 0 |
| Code_out[ 1] = 1 | 1 |
| Code_out[ 2] = 2 | 10 |
| Code_out[ 3] = 4 | 100 |
| Code_out[ 4] = 8 | 1000 |
| Code_out[ 5] = 16 | 1 0000 |
| Code_out[ 6] = 32 | 10 0000 |
| Code_out[ 7] = 64 | 100 0000 |
| Code_out[ 8] = 128 | 1000 0000 |
| Code_out[ 9] = 256 | 1 0000 0000 |
| Code_out[10] = 512 | 10 0000 0000 |
| Code_out[11] = 1024 | 100 0000 0000 |
| Code_out[12] = 2048 | 1000 0000 0000 |
| Code_out[13] = 4096 | 1 0000 0000 0000 |
| Code_out[14] = 8192 | 10 0000 0000 0000 |
| Code_out[15] = 16384 | 100 0000 0000 0000 |

In addition, the binary representations in TABLE III follow the two-1-pattern convention described above, while the binary representations in TABLE IV follow a one-1-pattern having only one logical 1 in each string to further reduce adding steps during number multiplication. The coding scheme of TABLE IV results in the lowest downstream processing for the four examples given. The four examples of TABLES I through IV represent different cost/performance tradeoffs. In addition, the combination of the Code_out step size and Discharge_factor provides a choice of transfer characteristic for the controller analog-to-digital converter.

The controller analog-to-digital converter of the present invention is low cost and low power, requiring only one comparator, two voltage reference inputs, four analog switches, two capacitors with a low capacitance ratio (less than 10x) and an optional offset cancellation circuit. Accuracy at the center of conversion is provided by a simple comparator configuration that allows high voltage accuracy at the center of conversion, with voltage error deriving mainly from the band-gap. Other approaches such as delay line, voltage-to-frequency conversion do not provide the same level of accuracy.

The controller analog-to-digital converter of the present invention displays low tracking jitter, as the very high resolution when V_in is near the center of conversion results in the system exhibiting low tracking jitter when operating in a closed-loop. On the other hand, high conversion gain when V_in is far away from the center of conversion allows fast loop acquisition. Less downstream processing is required when the output coding employed used a low number of 1's.

Two voltage reference inputs Vcenter_ref and Vcomparator_ref determine the center of conversion and gain gradient, respectively, and thus define the preferred range configuration for control loop applications. Conventional analog-to-digital converters use minimum and maximum voltages, a less promising approach. In addition, shifting the center of conversion in the controller analog-to-digital converter of the present invention to other voltages does not alter the comparator operating condition (e.g., common mode, etc.).

The reference value Vcomparator_ref has low values with a non-switched connection (other than transition from ground after sign comparison on V_in), providing ideal comparator operating conditions. In addition, the input switch configurations for switch SW1 to connection with either input node 2 or 3 therein allows an identical comparator common-mode voltage for positive and negative V_in levels (above and below Vcenter_ref). The input capacitor Csample filters and holds the input sample at the beginning of each conversion cycle, eliminating the need for additional sample and hold and input high frequency roll-off filters.

With the iterative conversion topology, the number of conversion cycles required is proportional to the number of Code_out levels implemented. The conversion clock cycles required by the iterative conversion topology increases acquisition latency, which may reduce the closed-loop stability margin. However, the non-linear stepping characteristic of the controller analog-to-digital converter allows fewer output levels to achieve the same level of performance provided by regular linear analog-to-digital converters so that latency may be reduced by employing fewer output levels and may not be significant. Moreover, the circuit simplicity, high voltage accuracy, low capacitance-ratio, low comparator requirements, low downstream processing requirements provide significant advantages in the performance measures for a single-chip application.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. An analog-to-digital converter comprising:
   one or more conversion devices capable of converting an initial input voltage value in nonlinear steps for each of one or more conversion iterations, wherein the one or more conversion devices include sampling and discharge capacitors, and wherein a step size for each conversion iteration is based upon a ratio of capacitances of the sampling and discharge capacitors; and a counting mechanism capable of counting a number of conversion iterations representing a difference between the initial input voltage value and a reference voltage value.

2. The analog-to-digital converter according to claim 1, further comprising:
a comparator capable of receiving a voltage on the sampling capacitor at a first input and a reference voltage at a second input, the comparator capable of producing a first logic signal if the voltage on the sampling capacitor is higher than the reference voltage and a second logic signal if the voltage on the sampling capacitor is lower than the reference voltage.

3. The analog-to-digital converter according to claim 2, further comprising:
switches capable of connecting the sampling capacitor to the first comparator input with a polarity depending upon whether the initial input voltage value is higher or lower than the reference voltage.

4. The analog-to-digital converter according to claim 2, wherein the counting mechanism is capable of counting a number of consecutive conversion iterations during which the comparator outputs the first logic signal.

5. An analog-to-digital converter comprising:
one or more conversion devices capable of converting an initial input voltage value in nonlinear steps for each of one or more conversion iterations; and
a counting mechanism capable of counting a number of conversion iterations representing a difference between the initial input voltage value and a reference voltage value, wherein the counting mechanism is capable of outputting a value representing the number of conversion iterations, and wherein a step size between consecutive output values increases with increases in the number of conversion iterations.

6. The analog-to-digital converter of claim 5, wherein:
the one or more conversion devices include sampling and discharge capacitors; and
the step size for each conversion iteration is based upon a ratio of capacitances of the sampling and discharge capacitors.

7. The analog-to-digital converter according to claim 5, wherein are each output value is selected to have a predetermined number of logical 1's within a binary string representing the output value.

8. The analog-to-digital converter according to claim 7, wherein the predetermined number is selected from the group including 1 and 2.

9. An analog-to-digital conversion method comprising:
converting an initial input voltage value in nonlinear steps for each of one or more conversion iterations, wherein converting the initial input voltage value includes employing sampling and discharge capacitors to convert the initial input voltage value in each conversion iteration, wherein a step size for each conversion iteration is based upon a ratio of capacitances of the sampling and discharge capacitors; and
counting a number of conversion iterations representing a difference between the initial input voltage value and a reference voltage value.

10. The method according to claim 9, further comprising:
comparing a voltage on the sampling capacitor at a first input and a reference voltage at a second input;
producing a first logic signal if the voltage on the sampling capacitor is higher than the reference voltage; and
producing a second logic signal if the voltage on the sampling capacitor is lower than the reference voltage.

11. The method according to claim 10, further comprising:
connecting the sampling capacitor to the first input with a polarity depending upon whether the initial input voltage value is higher or lower than the reference voltage.

12. The method according to claim 10, further comprising:
counting a number of consecutive conversion iterations during which the comparator outputs the first logic signal.

13. The method of claim 9, further comprising:
outputting a value representing the number of conversion iterations, wherein the step size between consecutive output values increases with increases in the number of conversion iterations.

14. An analog-to-digital conversion method comprising:
converting an initial input voltage value in nonlinear steps for each of one or more conversion iterations;
counting a number of conversion iterations representing a difference between the initial input voltage value and a reference voltage value; and
outputting a value representing the number of conversion iterations, wherein a step size between consecutive output values increases with increases in the number of conversion iterations.

15. The method according to claim 14, wherein each output value is selected to have a predetermined number of logical 1's within a binary string representing the output value.

16. The method according to claim 14, wherein the predetermined number is selected from the group including 1 and 2.

17. An analog-to-digital converter comprising:
a comparator having a first input selectively connected to a reference voltage and a second input selectively connected to a sampling capacitor, wherein a terminal of the sampling capacitor that is connected to the second input is selected based on whether an initial voltage on the sampling capacitor is higher or lower than the reference voltage;
a discharge capacitor selectively connected to the sampling capacitor and capable of discharging the sampling capacitor in nonlinear steps during each of one or more conversion iterations, wherein collective discharges for the one or more conversion iterations reduce a voltage across the sampling capacitor from the initial voltage to an ending voltage lower than the reference voltage; and
a counter capable of counting a number of conversion iterations required to reduce the voltage across the sampling capacitor from the initial voltage to the ending voltage.

18. The analog-to-digital converter according to claim 17, further comprising:
a count coder capable of receiving a count value from the counter and producing an output value representing the count value, wherein a step size between output values representing consecutive count values differs depending on the count value.

19. The analog-to-digital converter according to claim 18, wherein the output values produced by the count coder are selected to have a predetermined number of logical 1's within each binary string uniquely representing one output value.

20. The analog-to-digital converter according to claim 18, wherein the count coder is a lookup table.

* * * * *

UNITED STATES PATENT AND TRADEMARK OFFICE
CERTIFICATE OF CORRECTION

PATENT NO. : 7,250,884 B1
APPLICATION NO. : 11/284763
DATED : July 31, 2007
INVENTOR(S) : Hee Wong Page 1 of 1

It is certified that error appears in the above-identified patent and that said Letters Patent is hereby corrected as shown below:

Column 9, claim 7, line 43, delete "are".

Signed and Sealed this

Fourth Day of December, 2007

JON W. DUDAS
*Director of the United States Patent and Trademark Office*